(12) United States Patent
Huang et al.

(10) Patent No.: US 12,438,004 B2
(45) Date of Patent: Oct. 7, 2025

(54) METHOD FOR FORMING SEMICONDUCTOR DEVICE THAT INCLUDES FLASH MEMORY

(71) Applicant: Winbond Electronics Corp., Taichung (TW)

(72) Inventors: Yu-Jen Huang, Taichung (TW); Chu-Chun Hsieh, Taichung (TW); Hsiu-Han Liao, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 543 days.

(21) Appl. No.: 17/951,494

(22) Filed: Sep. 23, 2022

(65) Prior Publication Data
US 2023/0290642 A1    Sep. 14, 2023

(30) Foreign Application Priority Data
Mar. 10, 2022    (TW) .................................. 111108722

(51) Int. Cl.
*H01L 21/311*    (2006.01)
*H01L 21/762*    (2006.01)
*H10B 41/30*    (2023.01)

(52) U.S. Cl.
CPC .. *H01L 21/31111* (2013.01); *H01L 21/76224* (2013.01); *H10B 41/30* (2023.02)

(58) Field of Classification Search
CPC ......... H01L 21/31111; H01L 21/76224; H01L 21/31155; H10B 41/30; H10D 64/035

USPC .......................................................... 438/701
See application file for complete search history.

(56) References Cited

U.S. PATENT DOCUMENTS

| | | | |
|---|---|---|---|
| 7,494,874 B2 | 2/2009 | Ahn | |
| 2003/0054609 A1* | 3/2003 | Kobayashi | H10B 41/30 438/257 |
| 2006/0017093 A1* | 1/2006 | Kwon | H10B 41/30 257/317 |
| 2019/0319037 A1* | 10/2019 | Liu | H01L 21/76237 |
| 2019/0348426 A1* | 11/2019 | Cho | H10B 41/40 |
| 2022/0415914 A1* | 12/2022 | Lo | H10B 41/35 |

* cited by examiner

*Primary Examiner* — Mohammad M Hoque
(74) *Attorney, Agent, or Firm* — Muncy, Geissler, Olds & Lowe, P.C.

(57) ABSTRACT

A method for forming a semiconductor structure is provided. The method includes providing a semiconductor substrate with a plurality of floating gates on it, and an isolation structure between the floating gates. The method includes performing a first etching process to recess the isolation structure and to form an opening between the floating gates to expose a portion of the sidewalls of the floating gates. The method includes conformally forming a liner in the opening. The method includes performing an ion implantation process to implant a dopant into the isolation structure below the liner. The method includes performing a second etching process to remove the liner and a portion of the isolation structure below the liner, thereby giving the bottom portion of the opening a tapered profile.

20 Claims, 10 Drawing Sheets

METHOD FOR FORMING SEMICONDUCTOR DEVICE THAT INCLUDES FLASH MEMORY

CROSS REFERENCE TO RELATED APPLICATIONS

This application claims priority of Taiwan Patent Application No. 111108722 filed on Mar. 10, 2022, the entirety of which is incorporated by reference herein.

BACKGROUND

Technical Field

The present disclosure relates to a semiconductor structure, and in particular to a method for forming a flash memory.

Description of the Related Art

In order to increase the component density and improve the overall performance of flash memory devices, the current technology used in manufacturing flash memory devices keeps striving for scaling-down the component dimensions. However, many challenges arise when the device dimensions keep reducing. For example, in order to improve the coupling effect between the floating gates, the isolation structure between the floating gates requires an etch to a deeper depth, but this may expose the undercut structure of the floating gates, and the excessive depth will result in seams when the control gates are subsequently filled with material, causing the device to have reliability issues. Therefore, the industry still needs to improve the method of manufacturing flash devices in order to overcome the problems caused by scaling-down the component dimensions.

BRIEF SUMMARY

The present disclosure provides a method for forming a semiconductor device. A semiconductor substrate is provided. There are a plurality of floating gates on the semiconductor substrate. There is an isolation structure between the floating gates. The method includes the following steps. A first etching process is performed to recess the isolation structure and to form an opening between the floating gates to expose a portion of the sidewalls of the floating gates. A liner is conformally formed in the opening. An ion implantation process is performed to implant a dopant into the isolation structure below the liner. A second etching process is performed to remove the liner and a portion of the isolation structure below the liner, which gives the bottom portion of the opening a tapered profile.

By implementing the method of the present disclosure, a more convenient process may be utilized to perform the etching of the isolation structure between the floating gates to avoid exposing the undercut structure of the floating gates, and to facilitate the subsequent filling of the material of the control gates.

DETAILED DESCRIPTION

FIGS. 1-3, 4A, 5A, 6A and 7 illustrate cross-sectional views of intermediate stages of forming the semiconductor structure according to the embodiment of the present disclosure. FIGS. 4B, 5B and 6B illustrate enlarged cross-sectional views of intermediate stages of forming the semiconductor structure according to the embodiment of the present disclosure. In general, during the process of the flash memory, in order to avoid the coupling effect between the floating gates, the opening between the floating gates is usually formed at a depth lower than a bottom surface of the floating gates, thereby blocking the coupling effect between the floating gates. However, excessive etching of the isolation structure may expose the undercut structure of the floating gates and affect the reliability of the subsequently formed device. Accordingly, the embodiment of the present disclosure provides a method for forming a deeper opening while avoiding exposing the undercut structure of the floating gates.

Figure 1:
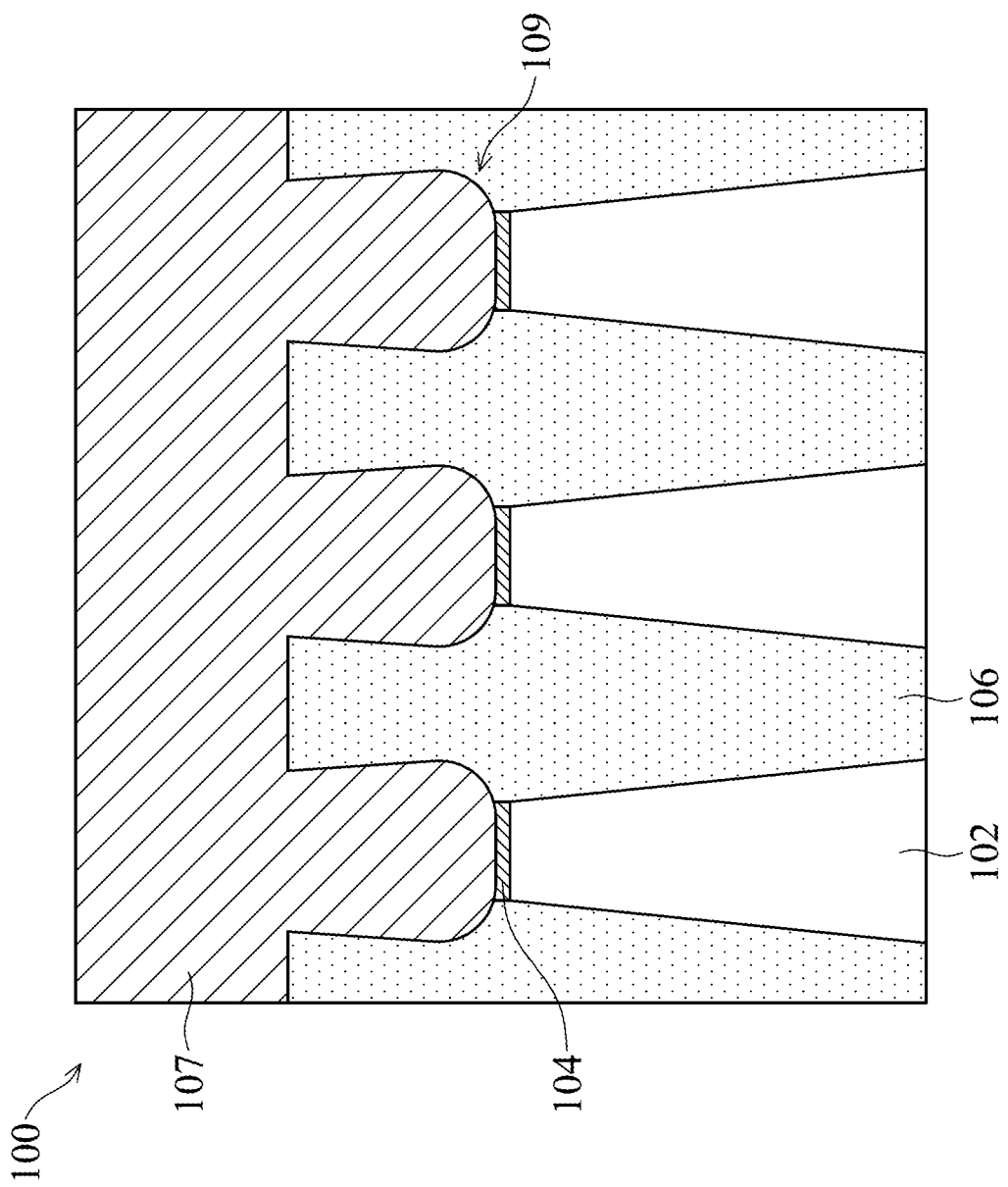
FIGS. 1-3, 4A, 5A, 6A and 7 illustrate cross-sectional views of intermediate stages of forming the semiconductor structure according to the embodiment of the present disclosure.

Refer to FIG. 1, which illustrates a cross-sectional view of the semiconductor structure 100. According to some embodiments, a semiconductor structure 100 is provided, and the semiconductor structure 100 includes a semiconductor substrate 102.

Still referring to FIG. 1, a tunnel layer 104, an isolation structure 106, and a floating gate layer 107 are sequentially formed on the semiconductor substrate 102. In some embodiments, the tunnel layer 104 is formed from silicon oxide. In some embodiments, the thickness of the tunnel layer 104 ranges from about 80 Å to about 120 Å. Next, the isolation structure 106 may be formed by performing appropriate etching on the substrate 102 to etch the isolation trenches, followed by performing processes such as spin-on coating, chemical vapor deposition (CVD) processes, atomic layer deposition (ALD) processes, other suitable processes, or a combination thereof. The isolation structure 106 is formed from silicon oxide. After forming the isolation structure 106, an appropriate etching process is performed on the semiconductor structure 100 to form gate recesses between the isolation structures 106, and a floating gate layer 107 is formed by filling the gate recesses between the isolation structures 106 with a conductive material, for example, a CVD process, other suitable process, or a combination thereof. The conductive material may include doped polysilicon, undoped polysilicon, metals, polycrystalline metal silicides (polycide), or a combination thereof.

Figure 2:
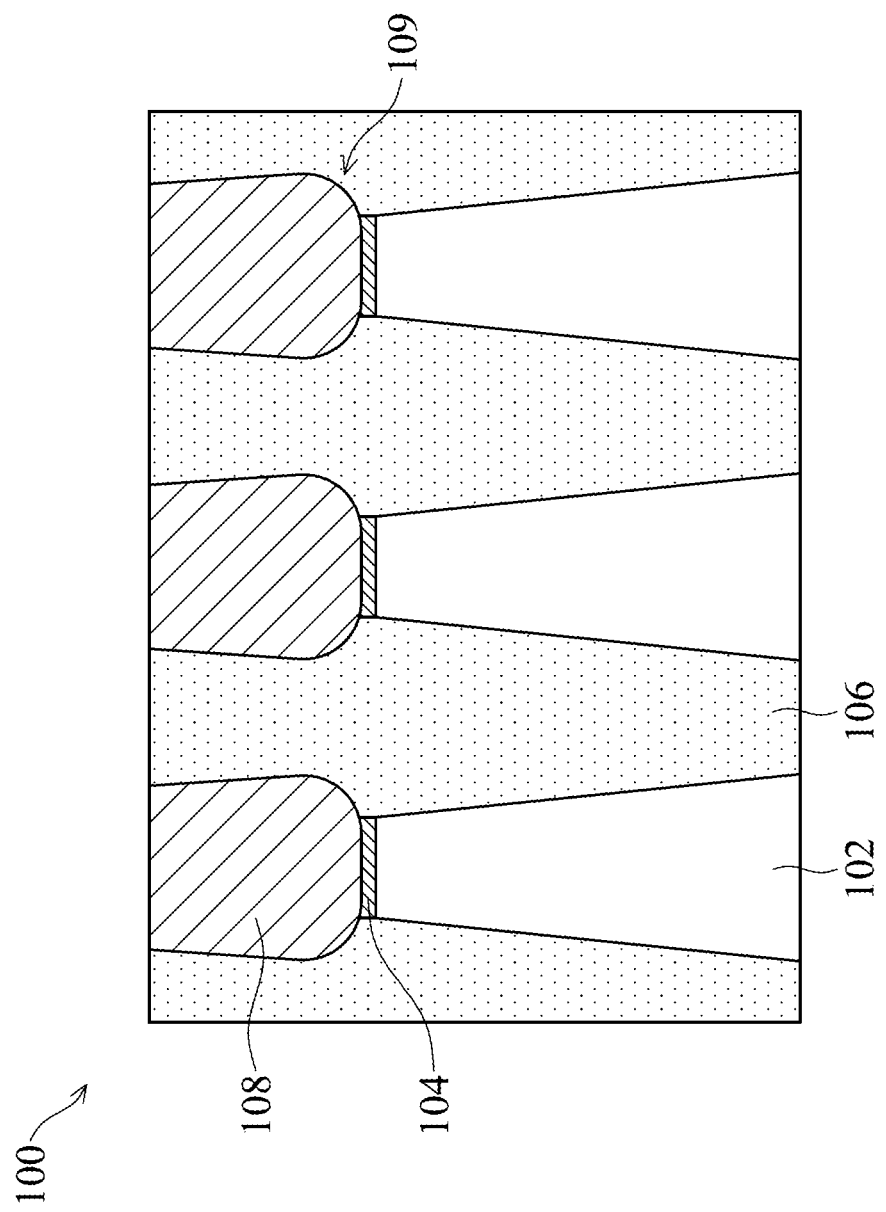

Referring to FIG. 2, after filling the gate recesses between the isolation structures 106, a planarization process such as chemical mechanical polishing (CMP) is performed to remove the conductive material outside the gate recesses, thereby forming a plurality of floating gates 108 and exposing a top surface of the isolation structures 106. It should be noted that, in some embodiments, since there may be issues with etching accuracy in the etching process for forming the gate recesses between the isolation structures 106, the bottom portion of the floating gates 108 may have an undercut structure 109, and opposite sides of the bottom of the floating gates 108 may have an arc-shaped profile, as shown in FIG. 2.

Figure 3:
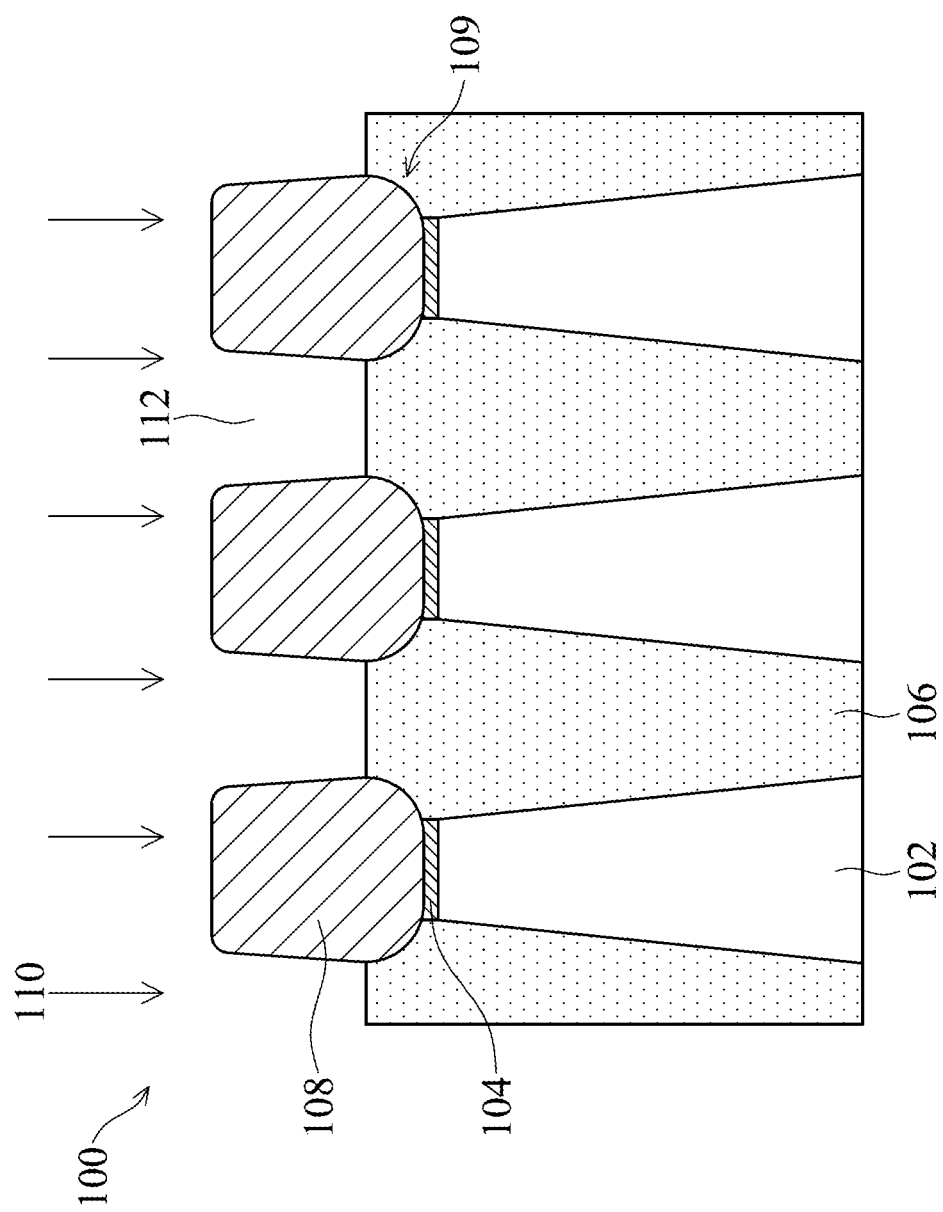

Next, referring to FIG. 3, a first etching process 110 is performed on the semiconductor structure 100 to recess the isolation structure 106 to form an opening 112 between the floating gates 108 to expose a portion of sidewalls of the floating gates 108. It should be noted that, in order to avoid exposing the undercut structure 109 of the floating gates 108, the first etching process 110 does not etch the isolation structure 106 to a depth lower than a bottom surface of the floating gates 108, but etches the isolation structure 106 to an appropriate depth and exposes the portion of the sidewalls of the floating gates 108. In some embodiments, a depth of the first etching process 110 etches the isolation structure 106 is 70% to 80% of the height of the floating gates 108. In some embodiments, the first etching process 110 is a wet etching process and may use an etchant including dilute hydrofluoric acid (DHF) or vapor hydrofluoric acid (VHF).

Figure 4A:
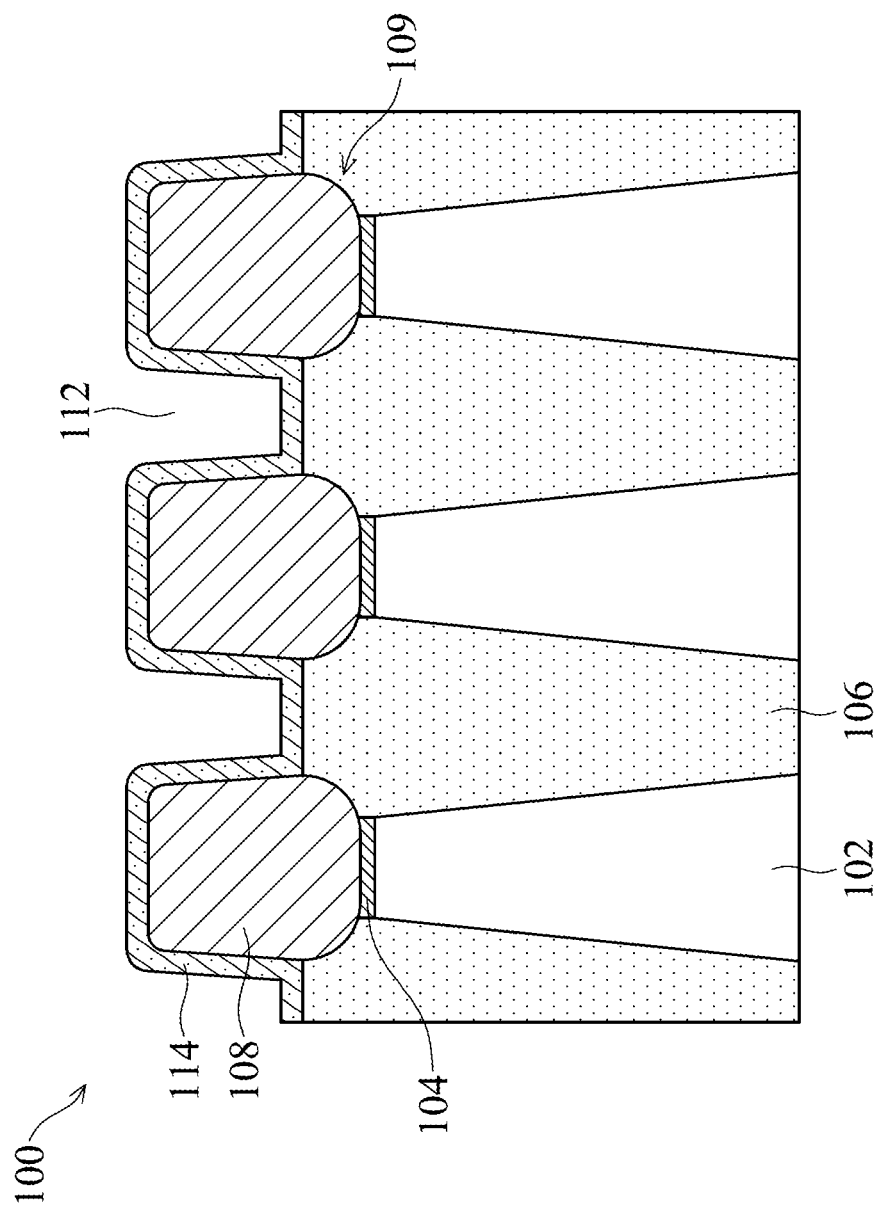
Figure 4B:
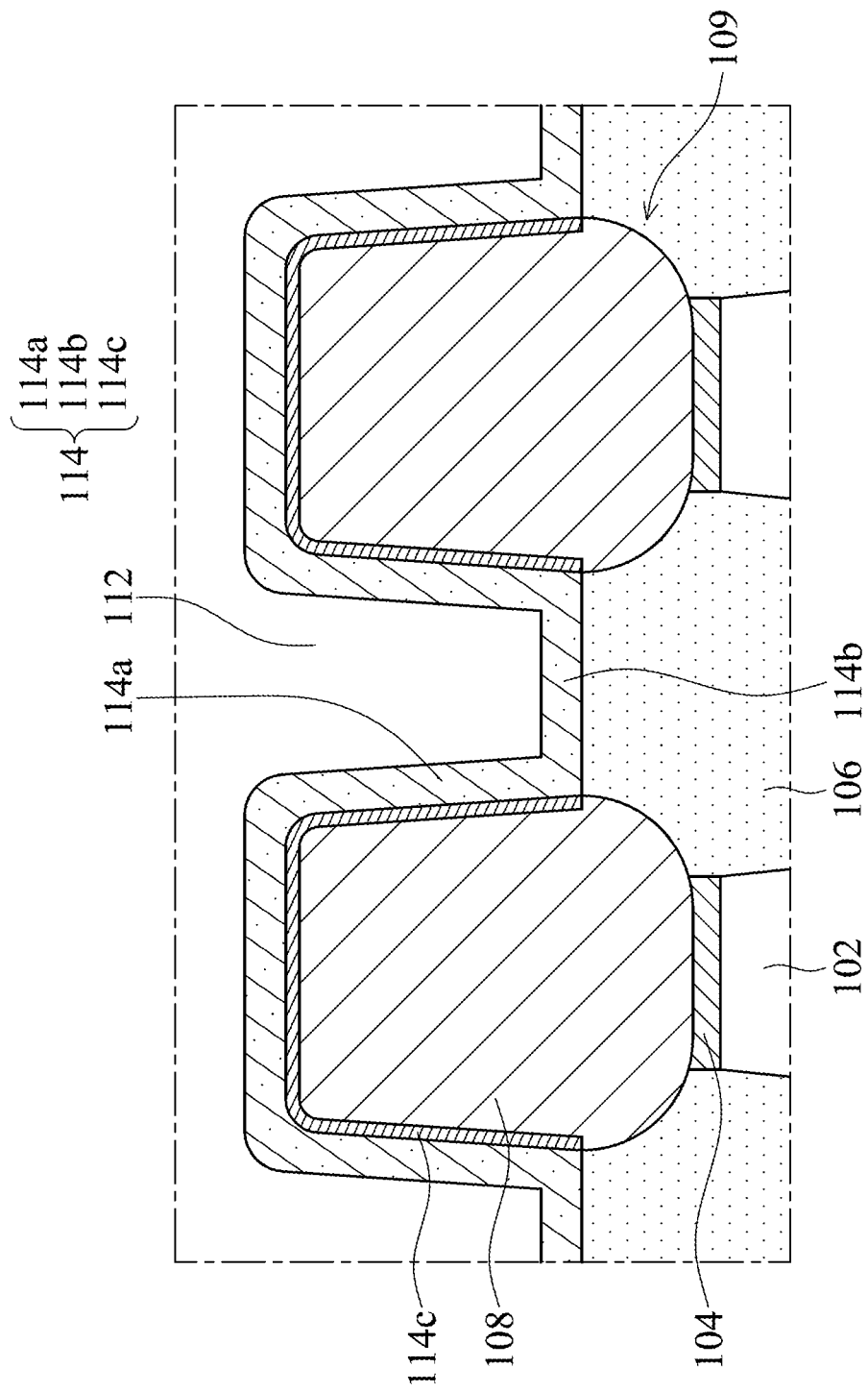
FIGS. 4B, 5B and 6B illustrate enlarged cross-sectional views of intermediate stages of forming the semiconductor structure according to the embodiment of the present disclosure.

Referring to FIG. 4A, the liner 114 is conformally formed on the semiconductor structure 100, i.e., the liner 114 covers a top surface and sidewalls of the floating gates 108 and a top surface of the isolation structure 106. During the subsequent ion implantation process, the liner 114 serves as a buffer layer to control the ion implantation profile of the isolation structure 106. In some embodiments, the liner 114 may be formed by ALD, CVD, or a combination thereof. In some embodiments, the liner 114 is an oxide, such as a silicon oxide formed using tetraethylorthosilicate (TEOS) as a precursor. In other embodiments, the liner 114 may also be an ALD silicon oxide or a low-k material. In some embodiments, a thickness of the liner 114 ranges from about 5 nm to about 30 nm. Next, refer to FIG. 4B, which illustrates a partial enlarged view of the floating gates 108 after the formation of the liner 114. In FIG. 4B, the liner 114 includes a vertical portion 114a covering the sidewalls of the floating gates 108 and a horizontal portion 114b covering the isolation structure 106. Further, in the embodiment where the floating gates 108 are formed from polysilicon and the liner 114 is oxide, since the process of forming the liner 114 includes an oxidation step, the formation of the liner 114 may include a step of oxidizing the top surface and the portion of the sidewalls of the floating gates 108 to silicon oxide, i.e., the liner 114 further includes an oxide portion 114c formed by oxidizing the top surface and the portion of the sidewalls of the floating gates 108.

Figure 5A:
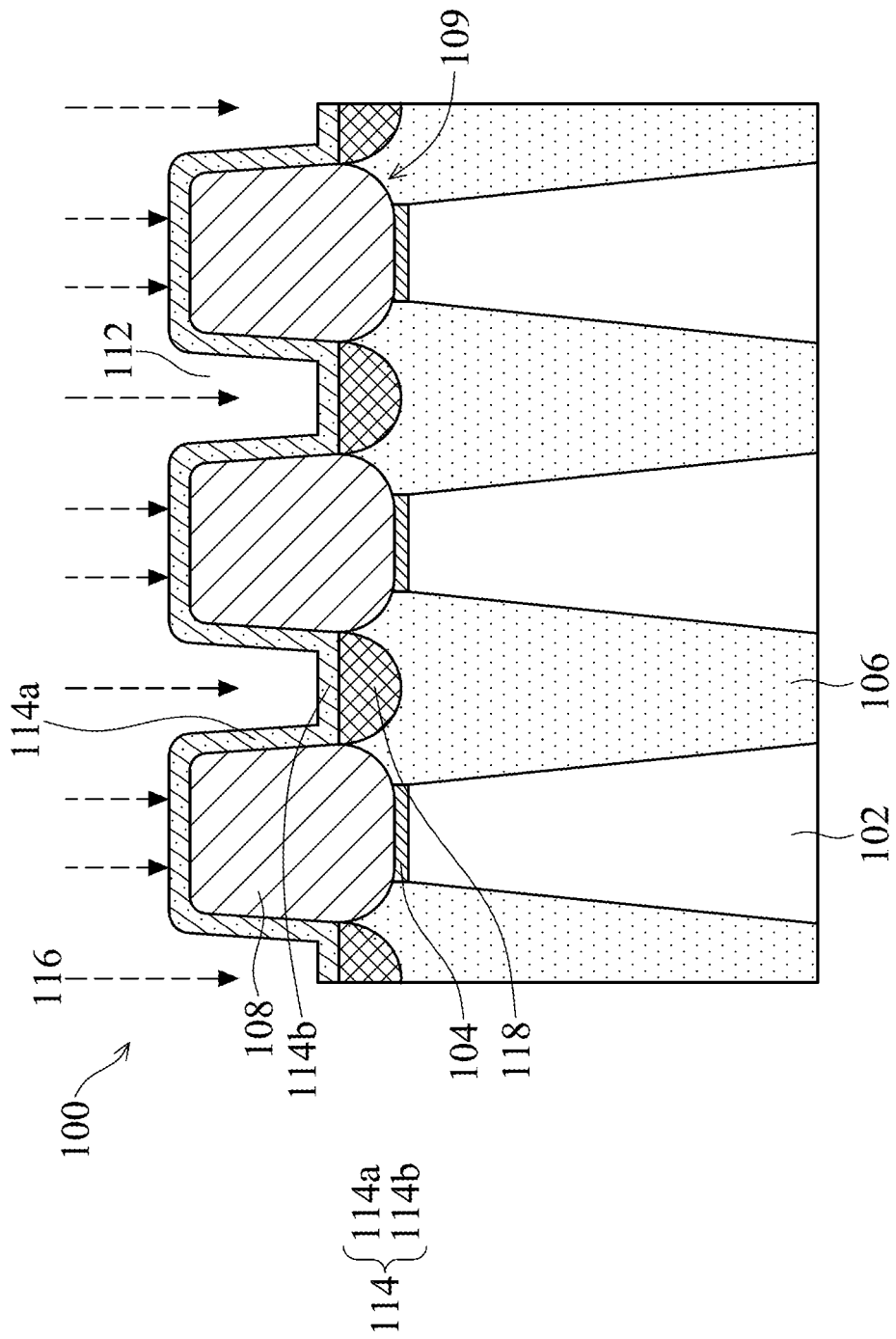
Figure 5B:
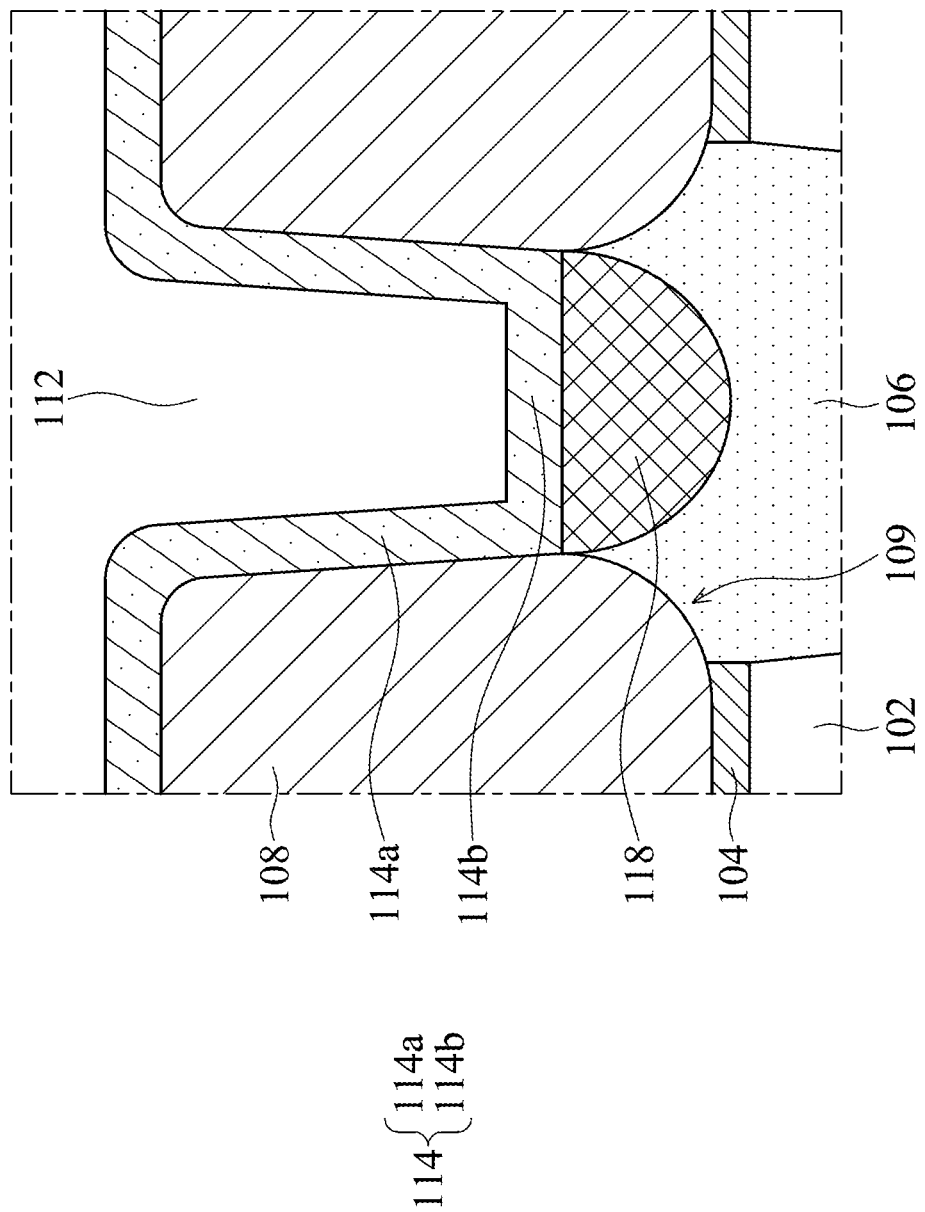

Referring to FIG. 5A, an ion implantation process 116 is performed on the semiconductor structure 100 to implant dopant into the liner 114 and the isolation structure 106 below the liner 114. The dopant of the ion implantation process 116 are selected so that the implanted isolation structure 106 has a greater etching rate in the subsequent etching process. For example, in some embodiments, a material of the dopant may include arsenic, phosphorus, germanium, or a combination thereof. In some embodiments, the ion implantation process 116 is performed at an energy of 1 KeV to 30 KeV. After performing the ion implantation process 116, the implantation region 118 is formed in the isolation structure 106. In some embodiments, a dopant concentration of the implantation region 118 ranges from $10^{12}$ atom/cm$^3$ to $10^{16}$ atom/cm$^3$. Next, refer to FIG. 5B, which illustrates a partial enlarged view of a peripheral of the opening 112 after the ion implantation process 116 is performed. Since the liner 114 is conformally formed on the semiconductor structure 100, compared with the ion implantation process 116 for the implantation of the isolation structure 106 below the vertical portion 114a of the liner 114, the implantation of the ion implantation process 116 for the isolation structure 106 below the horizontal portion 114b of the liner 114 has a deeper doping depth in this region because the dopant only needs to pass through the liner 114 of less thickness. Thus, a central of the implantation region 118 (below the horizontal portion 114b) has a deeper doping depth, while a peripheral of the implantation region 118 (below the vertical portion 114a) has a shallower doping depth, i.e., the doping depth of the implantation region 118 decreases from the center to its periphery of the isolation structure 106.

Figure 6A:
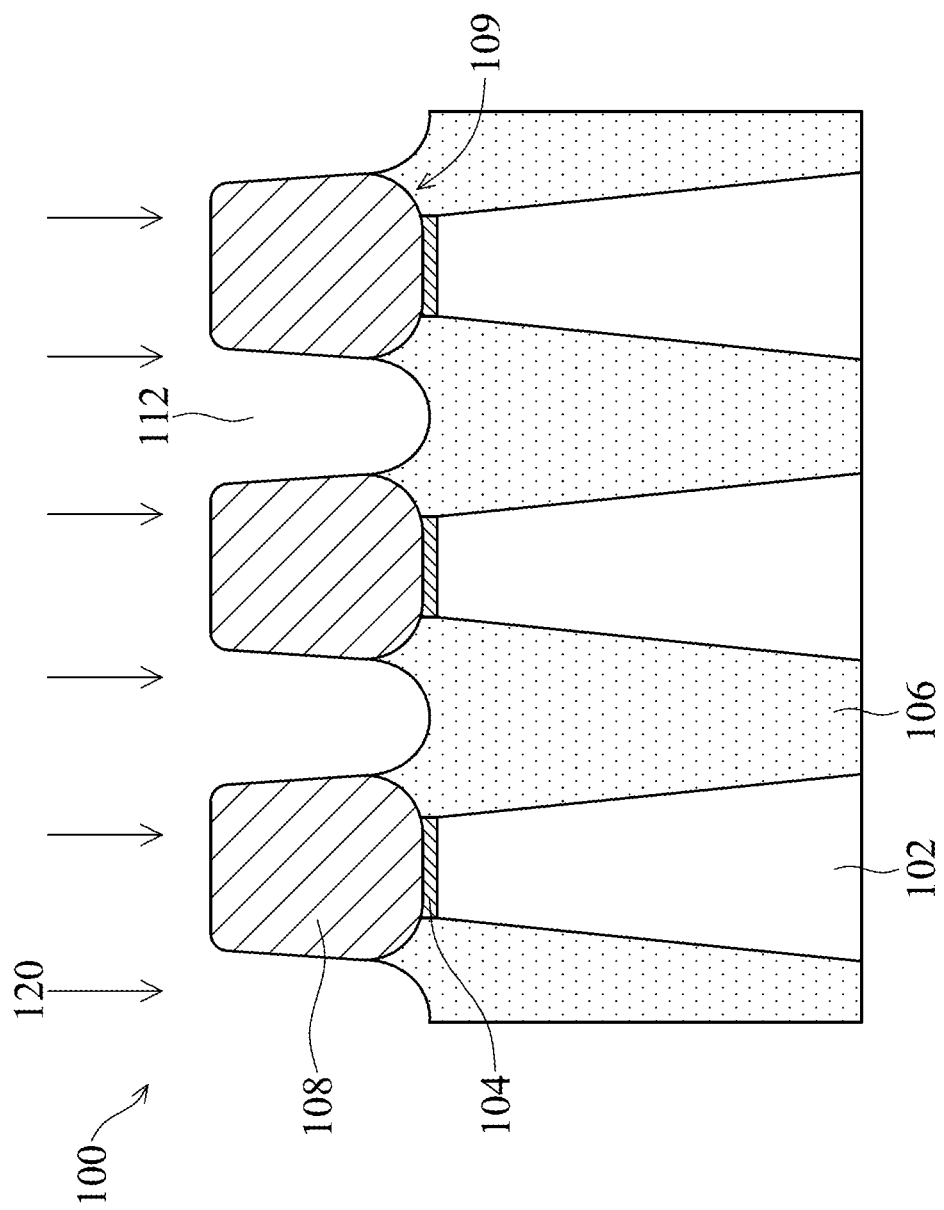
Figure 6B:
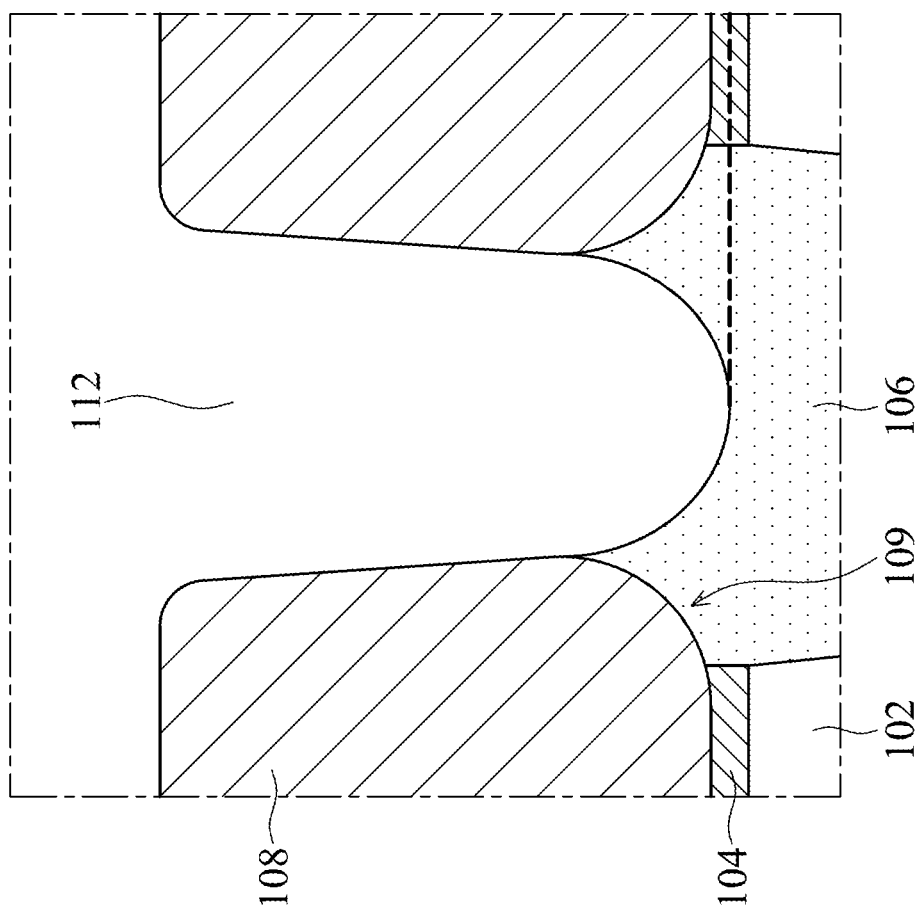

Referring to FIG. 6A, a second etching process 120 is performed on the semiconductor structure 100 to remove the liner 114 and a portion of the isolation structure 106. In some embodiments, the second etching process 120 may utilize the same wet etching process as the first etching process 110, but the etching time of the second etching process 120 is less than the first etching process 110. In the embodiment of the present disclosure, since the etching rate of an implantation region (or a doped portion) of the isolated structure 106 (e.g., the implantation region 118) is greater than an un-implantation region (or an undoped portion) of the isolated structure 106. For example, in some embodiments, the ratio of the etching rate of the implantation region (the doped portion) of the isolated structure 106 to the un-implantation region (the undoped portion) of the isolated structure 106 is about 1.2:1 to 3:1, the second etching process 120 preferentially removes the implantation region of the isolation structure 106 (e.g., the implantation region 118). Next, refer to FIG. 6B, which illustrates a partial enlarged of the peripheral of the opening 112 after the second etching process 120 is performed. After the removal of the implantation region 118, the bottom portion of the opening 112 forms a tapered profile as the doping depth distribution of the implantation region 118. In some embodiments, the bottom portion of the opening 112 has a U-shaped profile. In some embodiments, a level of a lowest point of the bottom portion of the opening 112 is lower than a level of the bottom surface of the floating gates, and the level of a lowest point of the bottom portion of the opening 112 is between levels of a bottom surface and a top surface of the tunnel layer 104, i.e., a deepest doping depth (a level of a lowest point) of the implantation region 118 is at least lower than a level of the bottom surface of the floating gates 108 and is between levels of the bottom surface and the top surface of the tunnel layer 104. This ensures that the quality of the tunnel layer 104 is not affected by the implantation region 118 after thermal annealing. In the embodiment described above, where the top surface and the portion of the sidewalls of the floating gates 108 are oxidized and formed into an oxidized portion 114c (as described in FIG. 4B), the second etching process 120 also removes the oxidized portion 114c after removing the liner 114, thereby increasing the width of the opening 112 and facilitating the subsequent control of gate formation. It should be noted that the second etching process 120 still leaves the undercut structure 109 of the floating gates 108 unexposed, which helps to maintain the performance of the device. In addition, in some embodiments of the present disclosure, since the first etching process 110 and the second etching process 120 are both the same wet etching process, the only difference is the etching time, thus providing convenience in the manufacturing process.

Figure 7:
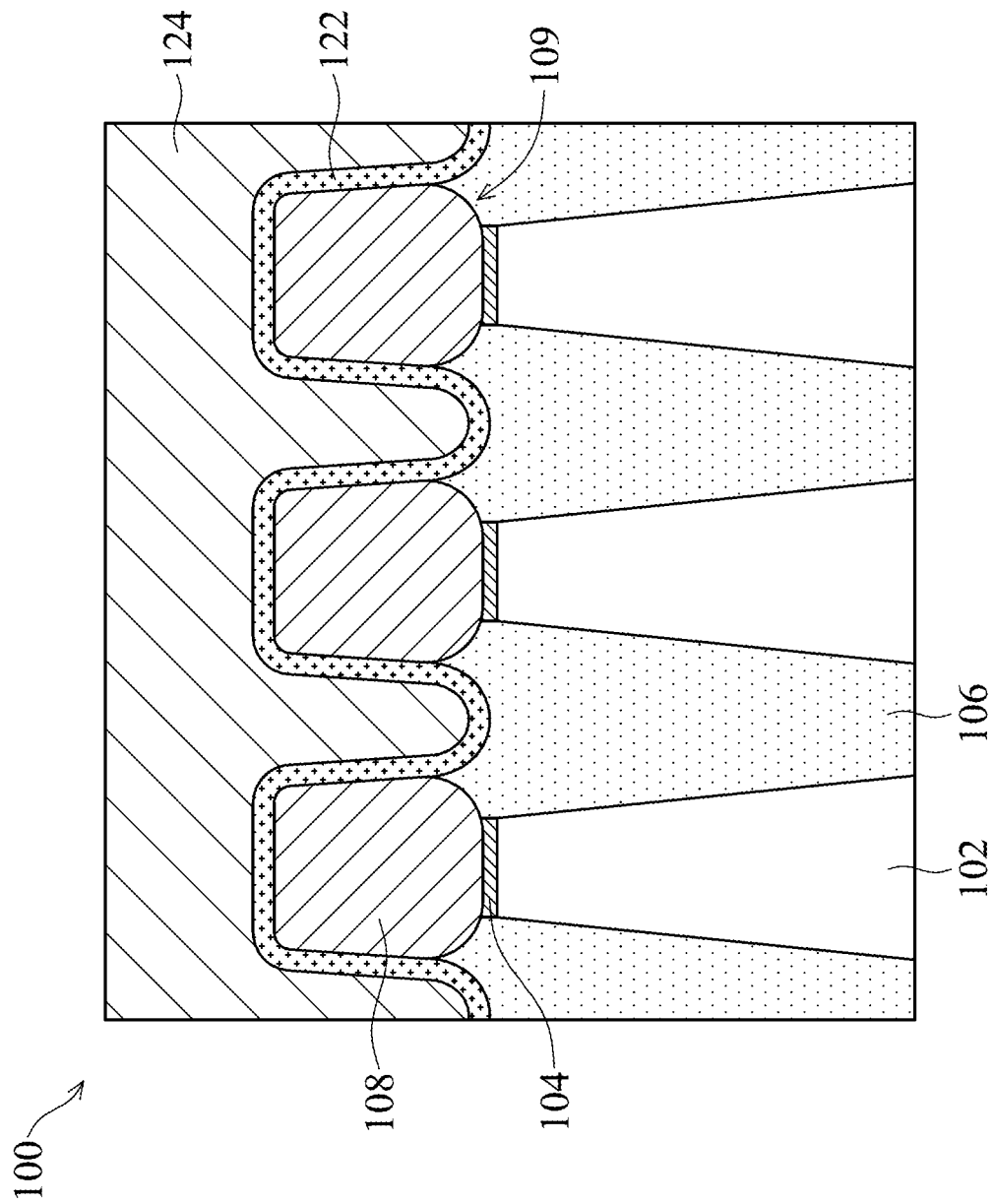

After forming the opening 112 with the tapering profile, further processes may be performed to fabricate the flash memory. For example, as shown in FIG. 7, an inter-gate dielectric layer 122 is formed on the semiconductor structure 100 to cover the top surface and the sidewalls of the floating gates 108 and the bottom portion of the opening 112, followed by forming a conductive layer 124 on the inter-gate dielectric layer 122 to serve as the control gate for the flash memory. In some embodiments, the inter-gate dielectric layer 122 may be a single-layer structure or a multi-layer structure, and a material of the inter-gate dielectric layer 122 may include silicon oxide, silicon nitride, or a combination thereof. For example, the inter-gate dielectric layer 122 may be a silicon oxide/silicon nitride/silicon oxide structure (ONO structure). In some embodiments, the conductive layer 124 may also be a single-layer or multi-layer structure, and a material of the conductive layer 124 may include polysilicon, metal, metal silicide, similar conductive material, or a combination thereof. After forming the conductive layer 124, further processes such as the etching of the conductive layer 124 or other further processes may be performed to continue the formation of other features, which are not described herein for brevity.

In summary, the embodiment of the present disclosure adjusts the doping depth of the isolation structure by forming a liner and performing an ion implantation process, and then removes the doped region of the isolation structure by an etching process to obtain a deeper opening depth, thus avoiding the possible coupling effect between the floating gates and not exposing the undercut structure of the floating gates after the etching process. In some embodiments, wet etching is used for both etching processes to avoid damage to the semiconductor structure (floating gates) caused by the plasma bombard of the dry etching process. In addition, in some embodiments, by oxidizing a part of the sidewalls of the floating gates as a portion of the liner, the oxidized portion of the sidewalls may be removed with the subsequent removal of the liner, thereby increasing the width of the opening and facilitating the subsequent control of the gate material filling.

The scope of the present disclosure is not limited to the technical solutions consisting of specific combinations of the technical features described above, but should also cover other technical solutions consisting of any combinations of the technical features described above or their equivalent features, all of which are within the scope of the protection of the present disclosure.

What is claimed is:

1. A method for forming a semiconductor device, comprising:
   providing a semiconductor substrate with a plurality of floating gates thereon and an isolation structure between the plurality of floating gates;
   performing a first etching process to recess the isolation structure and form an opening between the plurality of floating gates to expose a portion of sidewalls of the plurality of floating gates;
   conformally forming a liner in the opening;
   performing an ion implantation process to implant a dopant into the liner and the isolation structure below the liner; and
   performing a second etching process to remove the liner and a portion of the isolation structure below the liner, thereby forming a tapered profile at a bottom portion of the opening.

2. The method as claimed in claim 1, wherein the liner comprises a vertical portion and a horizontal portion, and after the ion implantation process, a doping depth of the isolation structure below the horizontal portion is greater than a doping depth of the isolation structure below the vertical portion.

3. The method as claimed in claim 2, wherein an etching rate of the second etching process for a doped portion of the isolation structure is greater than an etching rate of the second etching process for an undoped portion of the isolation structure.

4. The method as claimed in claim 3, wherein a ratio of the etching rate of the second etching process for the doped portion of the isolation structure to the etching rate of the second etching process for the undoped portion of the isolation structure ranges from 1.2:1 to 3:1.

5. The method as claimed in claim 2, wherein a doping depth of the isolation structure gradually decreases from center to periphery of the isolation structure.

6. The method as claimed in claim 1, wherein the bottom portion of the opening is a U-shaped profile.

7. The method as claimed in claim 1, wherein a depth of the first etching process recesses the isolation structure is 70% to 80% of a height of the plurality of floating gates.

8. The method as claimed in claim 1, wherein a material of the dopant comprises arsenic, phosphorus, germanium, or a combination thereof.

9. The method as claimed in claim 1, wherein the second etching process results in a level of a lowest point of the bottom portion of the opening being lower than a level of a bottom surface of the plurality of floating gates.

10. The method as claimed in claim 9, wherein a tunnel layer is disposed between the semiconductor substrate and the plurality of floating gates, and the second etching process results in the level of the lowest point of the bottom portion of the opening being between levels of a bottom surface and a top surface of the tunnel layer.

11. The method as claimed in claim 1, wherein a material of the liner and the isolation structure comprises oxide.

12. The method as claimed in claim 1, wherein the steps of forming the liner comprises oxidizing a part of sidewalls of the plurality of floating gates as a portion of the liner, and the second etching process comprises removing the oxidized portion to increase a width of the opening after removing the liner.

13. The method as claimed in claim 1, wherein the plurality of floating gates has an undercut structure, and the undercut structure is not exposed by the first etching process.

14. The method as claimed in claim 13, wherein the undercut structure is not exposed by the second etching process.

15. The method as claimed in claim 1, wherein the ion implantation process forms an implantation region in the isolation structure, a level of a lowest point of the implantation region is at least lower than a level of a bottom surface of the plurality of floating gates.

16. The method as claimed in claim 15, wherein a dopant concentration of the implantation region ranges from $10^{12}$ atom/cm$^3$ to $10^{16}$ atom/cm$^3$.

17. The method as claimed in claim 1, wherein a material of the plurality of floating gates comprises doped polysilicon or undoped polysilicon.

18. The method as claimed in claim 1, wherein the first etching process is a wet etching process and an etchant comprises dilute hydrofluoric acid (DHF) or vapor hydrofluoric acid (VHF).

19. The method as claimed in claim 1, wherein a thickness of the liner ranges from about 5 nm to about 30 nm.

20. The method as claimed in claim 1, wherein energy of the ion implantation process ranges from 1 KeV to 30 KeV.

* * * * *